United States Patent [19]

Grodzinski et al.

[11] Patent Number: 5,547,898
[45] Date of Patent: Aug. 20, 1996

[54] METHOD FOR P-DOPING OF A LIGHT-EMITTING DEVICE

[75] Inventors: Piotr Grodzinski, Chandler, Ariz.;
Hsing-Chung Lee, Calabasas, Calif.;
Chan-Long Shieh, Paradise Valley, Ariz.

[73] Assignee: Motorola, Schaumburg, Ill.

[21] Appl. No.: 529,468

[22] Filed: Sep. 18, 1995

Related U.S. Application Data

[63] Continuation of Ser. No. 270,719, Jul. 5, 1994, abandoned.

[51] Int. Cl.$^6$ .................................... H01L 21/20
[52] U.S. Cl. ..................... 437/129; 437/107; 437/110; 117/102
[58] Field of Search .................... 437/129, 107, 437/110; 117/102

[56] References Cited

U.S. PATENT DOCUMENTS

| | | | |
|---|---|---|---|
| 5,116,455 | 5/1992 | Daly | 117/93 |
| 5,168,077 | 12/1992 | Ashizawa et al. | 437/107 |
| 5,226,055 | 7/1993 | Downey et al. | 372/99 |
| 5,244,829 | 9/1993 | Kim | 437/133 |

OTHER PUBLICATIONS

R. M. Lum et al. "Controlled doping of GaAs films grown with tertiarybutylarsine" J. Appl. Phys. 67(10), 15 May 1990, pp. 6507–6512.

M. A. Tischler, et al. "Acceptor doping of (Al,Ga)As using carbon by metalorganic vapor phase epitaxy," Journal of Crystal Growth 107 (1991) pp. 268–73.

Kobayashi, et al. "Carbon–Doped GaAs Grown by Metalorganic Vapor Phase Epitaxy Using TMAs and TEG," Journal of Crystal Growth 102 (1990) pp. 183–186.

*Primary Examiner*—Robert Kunemund
*Assistant Examiner*—Linda J. Fleck
*Attorney, Agent, or Firm*—Gary F. Witting; Eugene A. Parsons

[57] ABSTRACT

A method for controlling carbon doping levels in a Distributed Bragg Reflectors (DBRs) for a Vertical Cavity Surface Emitting Laser (VCSELs) devices is provided. A first stack of mirrors (105) is deposited on the surface (101) of the substrate (102). A first cladding region (106) is deposited on the first stack of mirrors (105). An active layer (108) is deposited on the first cladding layer (106). A second cladding layer (109) is deposited on the active layer (108). A second stack of mirrors (111) is deposited on the second cladding layer (109) having a carbon doping level controlled by ratio of Group V containing organometallic (tertiarybutylarsine) to Group III organometallics (trimethylgallium and trimethylaluminum).

16 Claims, 3 Drawing Sheets

METHOD FOR P-DOPING OF A LIGHT-EMITTING DEVICE

This application is a continuation of prior application Ser. No. 08/270,719, filed Jul. 5, 1994 now abandoned.

BACKGROUND OF THE INVENTION

This invention relates, in general, to doping of a semiconductive material, and more particularly, to doping of layers used in a light-emitting device.

Recently, there has been an increased interest in a laser device called a vertical cavity surface emitting laser (VCSEL). Advantages of VCSEL devices are that the device emits light perpendicular to the wafer, providing better potential for the array formation, integration, as well as on-wafer testing. Conventionally, VCSEL devices utilize highly doped aluminum gallium arsenide layers ($Al_xGa_{1-x}As/Al_yGa_{1-y}As$) in their Distributed Bragg Reflectors (DBRs). These VCSEL devices generally operate with a range of wavelengths that approximates the visible (0.65 microns) to the infrared (0.98 microns). Thus, DBRs are made to reflect wavelengths longer than 0.57 microns. Typically, DBRs are doped with either a p-type dopant or an n-type dopant. Growth of these layered structures is achieved by epitaxial growth techniques, such as MOCVD (Metal-organic Chemical Vapor Deposition), MBE (Molecular Beam Epitaxy), or CBE (Chemical Beam Epitaxy).

However, selection of an appropriate p-type dopant for fabricating these doped layers is now a problem. For example, while zinc (Zn) is commonly used as a p-type dopant in MOCVD, it possesses a very high diffusion coefficient, thus making it unusable for doping DBRs. Another commonly used p-type dopant source is carbon tetrachloride ($CCl_4$) for carbon (C), which is a p-type dopant. Unfortunately, carbon tetrachloride is an ozone depleting material that is currently being withdrawn from use, thus making $CCl_4$ unusable. Since these two commonly used p-type dopants are not usable, it is clear that an alternate technique or method for p-doping for DBRs is necessary.

It can be seen that use of conventional p-type dopant materials do not meet the requirements for manufacturing or environmental considerations. Therefore, an alternative technique or method for p-type doping DBRs that will improve or equal performance levels, that will not impact environmental concerns, and that will simplify the method for fabrication would be highly desirable.

SUMMARY OF THE INVENTION

Briefly stated, a method for controlling carbon doping levels in a deposited material for a light-emitting device is provided. A substrate having a surface is provided. A first stack of mirrors is deposited on the surface of the substrate. A first cladding region is deposited on the first stack of mirrors. An active layer is deposited on the first cladding layer. A second cladding layer is deposited on the active layer. A second stack of mirrors is deposited on the second cladding layer, with at least the first layer of the second stack of mirrors having a carbon doping level controlled by the ratio of a Group V organometallic tertiarybutylarsine (TBAs) to gallium and aluminum containing organometallics of Group III.

DETAILED DESCRIPTION OF THE DRAWINGS

Figure 1:
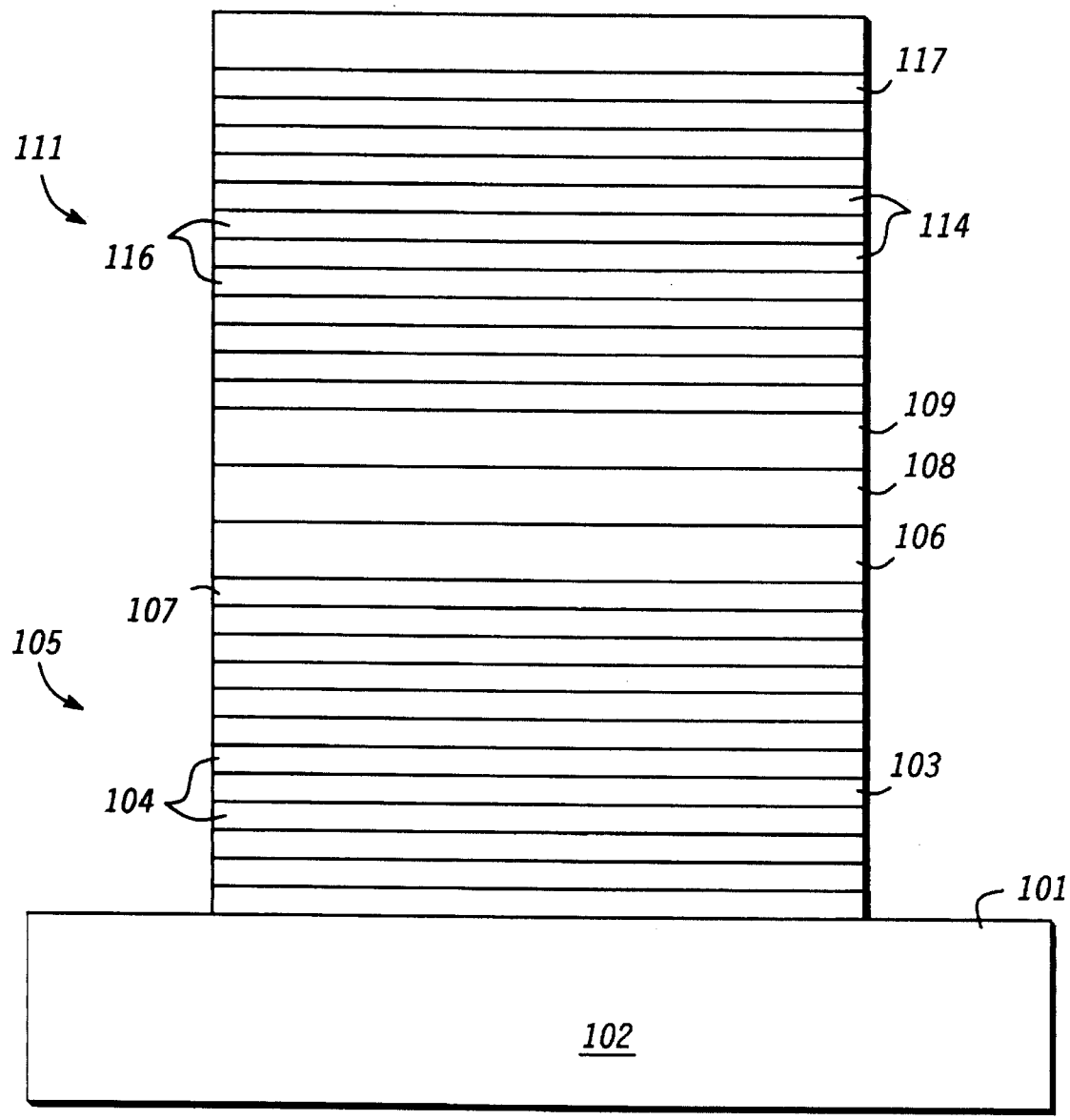
FIG. 1 illustrates an example of an enlarged simplified cross-section of a VCSEL device prepared on a semiconductor substrate.

Illustrated in FIG. 1 is an example of a simplified enlarged cross-sectional view of a VCSEL 100 structure. Generally, VCSEL 100 structure is made of several main parts, such as DBRs 105, a cladding region 106, an active region 108, a cladding region 109, and DBRs 111. It should be understood that VCSEL 100 structure can be processed into a variety of configurations, such as a planar VCSEL device, a mesa-etched VCSEL device, a ridge-waveguide VCSEL device, a light emitting diode, and the like. Further, while only one VCSEL structure 100 is shown on a surface 101 of a substrate 102, it should be understood that a multitude of VCSEL devices or structures can be formed on substrate 102 so as to form an array of devices.

Generally, substrate 102 is made of any suitable semiconductor material, such gallium arsenide that is n-doped, p-doped, or semi-insulating; however, in this particular example, substrate 102 is made of gallium arsenide. Gallium arsenide is used as substrate 102 to facilitate epitaxial growth of multiple layers of aluminum gallium arsenide with different aluminum contents, respectively.

Epitaxial deposition of DBRs 105 having alternating layers 103 and 104 of different aluminum compositions in $Al_xGa_{1-x}As$ is accomplished by state-of-the-art epitaxial techniques, such as MOCVD, MBE, CBE, and the like. These techniques enable epitaxial deposition of semiconductor layers of a variety of materials, such as gallium arsenide, aluminum gallium arsenide, aluminum arsenide, indium gallium arsenide, and the like.

By way of example, epitaxial deposition of DBRs 105, having alternating films or layers 103 and 104 of aluminum gallium arsenide doped with any suitable n-type dopant, such as silicon (Si), selenium (Se), or the like, is deposited on surface 101 of substrate 102. Deposition of alternating layers 103 and 104 form a first set of DBRs or mirrors 105 for VCSEL 100 structure. Thicknesses of alternating layers 103 and 104 of aluminum gallium arsenide generally are set at one quarter of a wavelength that VCSEL 100 structure is designed to operate at. Further, it should be understood that a chosen number of layers 103 and 104 has to provide a specified amount of reflectivity for VCSEL 100.

Cladding region 106 is epitaxially deposited on DBRs 105 having alternating layers 103 and 104. Cladding region 106 typically has two parts, which are not shown to avoid overcrowding of FIG. 1. First, an n-doped aluminum gallium arsenide layer ranging between 600 angstroms to 1,000 angstroms thick is deposited on the top of DBRs 105. Doping of the aluminum gallium arsenide is typically kept in the 1E18 cm$^{-3}$ range. Second, an undoped aluminum gallium arsenide layer of lower aluminum composition with a thickness ranging from 300 angstroms to 700 angstroms is deposited on the aluminum gallium arsenide layer that is n-doped.

Active region 108 is epitaxally deposited on cladding region 106. Active region 108 is commonly made of one or more layers of gallium arsenide or indium gallium arsenide to form quantum wells, which are separated with aluminum gallium arsenide or gallium arsenide barrier layers. Nominal thickness of both quantum wells and barriers is kept around 100 angstroms.

Cladding region 109 is epitaxially deposited on active region 108. Cladding region 109 is commonly made of two parts, which are not shown to avoid overcrowding of FIG. 1. First, an undoped aluminum gallium arsenide layer is deposited on active region 108. Thickness of the undoped aluminum gallium arsenide layer ranges from 300 angstroms to 700 angstroms. Second, a p-doped aluminum gallium arsenide layer is deposited on the undoped aluminum gallium arsenide layer. Doping of the p-doped aluminum gallium arsenide is kept at 1E18 cm$^{-3}$ level. Thicknesses of the p-doped aluminum gallium arsenide layer range from 600 angstroms to 1,000 angstroms. Thicknesses of cladding layers 106, 109 and active region 108 are chosen in such a way that the total optical thickness of these regions is equal to one wavelength or multiple wavelengths of the operating wavelength of the VCSEL device.

DBRs or mirrors 111 are epitaxially deposited on second cladding region 109. Mirrors or DBR 111 are typically made of alternating layers 114 and 116 of p-doped aluminum gallium arsenide with alternating aluminum concentrations of 15 and 80 percent, respectively, with a nominal range of ±5 percent. Corresponding p-type doping concentrations for alternating aluminum concentrations range from 1E17 cm$^{-3}$ to 5E18 cm$^{-3}$. Thicknesses of alternating layers 114 and 116 are set at a quarter wavelength at which VCSEL 100 is designed to operate. Further, thickness of an aluminum gallium arsenide layer 117, having a 15 percent aluminum content, which is the last layer of aluminum gallium arsenide on DBRs 111, is set at a thickness of either three quarters of a wavelength or one half a wavelength, instead of one quarter wavelength as used in the other alternating layers 114 and 116.

Reflection in DBRs 105 and 111 comprising $Al_xGa_{1-x}As/Al_yGa_{1-y}As$, e.g., with x=0.15 and with y=0.80 for VCSEL 100 that operates at 0.85 microns, occurs because of a difference in refractive indexes. The difference in refractive indexes is due to differing aluminum concentration found in alternating layers 103, 104 and 114 and 116 of DBRs 105 and 111, respectively. Also, bandgap of the $Al_xGa_{1-x}As/Al_yGa_{1-y}As$ varies with the aluminum content generating a heterobarrier between adjacent $Al_xGa_{1-x}As/Al_yGa_{1-y}As$ layers within the DBRs 105 and 111. The heterobarrier further determines a series resistance of DBRs 105 and 111 with a larger heterobarrier height relating to a larger series resistance. In order to minimize the series resistance, aluminum composition is graded at an interface between alternating layers 103, 104 and 114 and 116. Further, decease of the heterobarrier and the series resistance can be achieve by local enhancement of doping at the interface.

In the present invention, p-type doping of DBRs or mirrors 111 is accomplished by intrinsic carbon (C), which is released during the decomposition of organometallic sources of aluminum and gallium, typically trimethylaluminum (TMAl) and trimethylgallium (TMGa). Control of the p-doping level in aluminum gallium arsenide layers 114 and 116 is achieved by varying a ratio (V/III ratio) of a Group V organometallic, e.g., tertiarybutylarsine (TBAs) to a Group III organometallic, e.g., trimethylaluminum (TMAl) and trimethylgallium (TMGa). The p-doping level can be selected by variation of V/III ratio, since the atomic hydrogen produced during the decomposition of tertiarybutylarsine reduces carbon incorporation.

While the hereinbelow described process is for an Aixtron MOCVD epitaxial deposition system, it should be understood that other epitaxy systems could be used with suitable changes in process parameters to allow for system variation and characteristic differences. Briefly, substrate 102 is placed in a reaction chamber of the MOCVD system, having a temperature ranging from 700 to 900 degrees Celsius with a pressure ranging from 15 to 25 millibars. However, in a preferred embodiment of the present invention, temperature of the reaction chamber is set approximately 720 degrees Celsius and pressure is set at approximately 20 millibars. Gas flows or vapors of reactants, using hydrogen gas as a carrier, are TMAl ranging from 10 to 60 sccm, TMGa ranging from 7 to 30 sccm, and TBAs ranging from 70 to 110 sccm. It should be understood that similar results can be obtained in MOCVD processes under a wide range of temperatures and pressures; thus, examples provided herein are for illustration purposes only, so as to clearly illustrate the present invention.

By providing an appropriate ratio of Group V containing organometallic to Group III organometallics, films of aluminum gallium arsenide with 15% and 80% aluminum concentrations having carbon concentrations from 1E16 cm$^{-3}$ to 1E17 cm$^{-3}$ and 3E17 cm$^{-3}$ to 3E18 cm$^{-3}$ respectively, are achieved, thereby providing appropriate p-doping levels for DBR or mirrors 111 of VCSEL device structure 100. Further, by utilizing the appropriate ratio of Group V and Group III organometallic gases or vapors embodied in the present invention, p-type doping of layers for light-emitting devices, such as VCSELs, light emitting diodes, and the like, is simplified due to removal of CCl$_4$ from the process. Thus, appropriate p-type dopant concentrations in alternating aluminum gallium arsenide layers of DBRs 111 further reduces series resistance of reflector regions 111 and enables injection current flow through the DBRs or mirrors 111.

Figure 2:
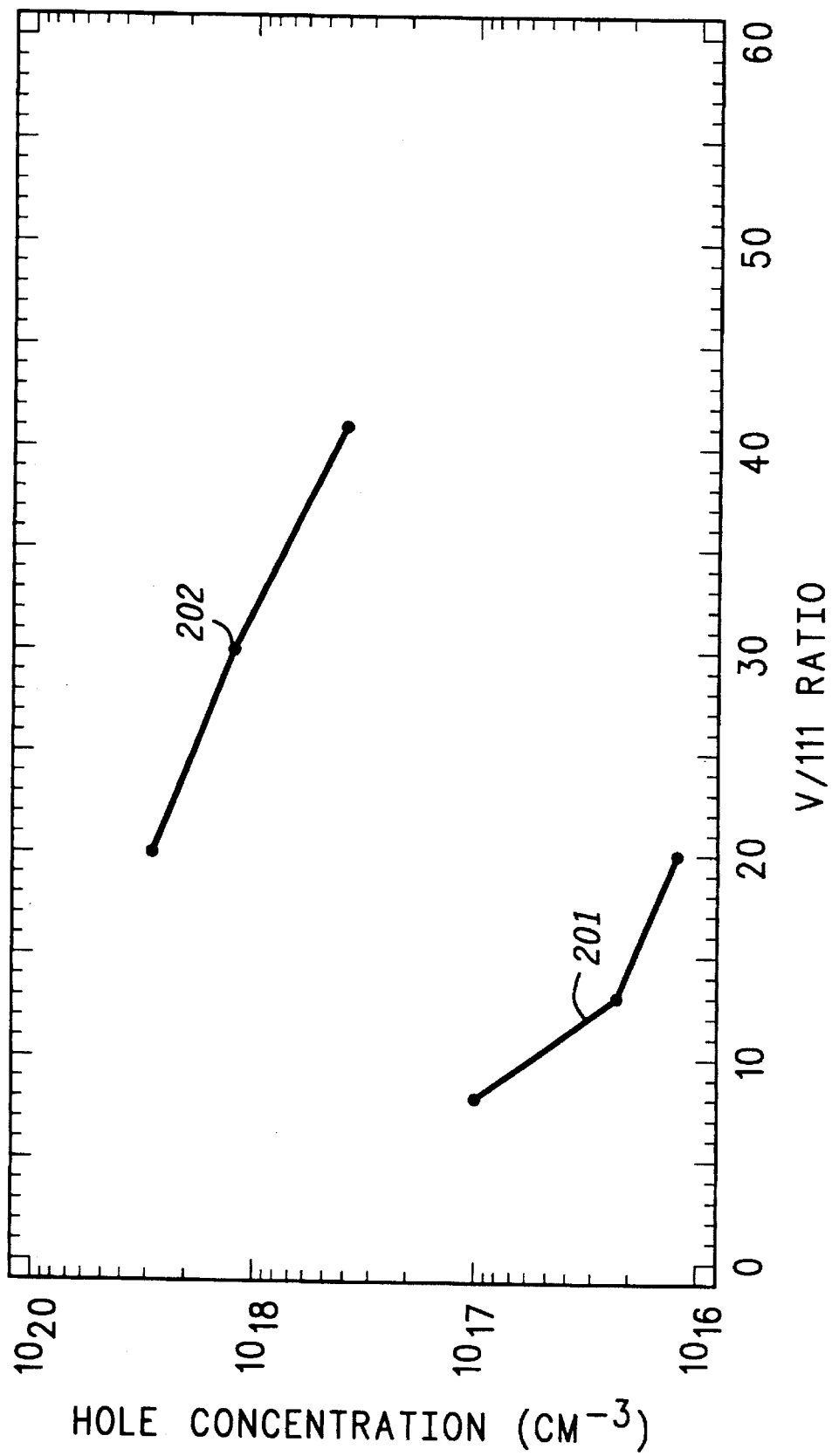
FIG. 2 is a graph of hole concentration reflecting carbon concentration in $Al_xGa_{1-x}As$ (x=0.15, x=0.80, respectively) versus a ratio of tertiarybutylarsine to trimethylgallium and trimethylaluminum (V/III ratio)

FIG. 2 is a graph illustrating carbon concentration versus ratios of Group V containing organometallic gas or vapor to Group III organometallic source gases or vapors. In the present graph, the Group V organometallic source gas was tertiarybutylarsine, and Group III organometallic source gases were trimethylgallium and trimethylaluminum. Curve 201 demonstrates p-type doping concentration, i.e., carbon in an aluminum gallium arsenide layer, having 15 percent aluminum concentration deposited in accordance with the present invention. Concentration of p-doping level (carbon concentration) ranges from 1E16 cm$^{-3}$ to 1E17 cm$^{-3}$, thus demonstrating a variable concentration of carbon doping in an aluminum gallium arsenide film by the variation of V/III ratio. Curve 202 represents p-type doping concentration, i.e., carbon in an aluminum gallium arsenide layer, having 80 percent aluminum concentration. Concentration of p-doping levels (carbon concentration) ranges from 3E17 cm$^{-3}$ to 3E18 cm$^{-3}$. Thus, by selecting an appropriate ratio of Group V to Group III organometallics source gasses, aluminum gallium arsenide films with appropriate doping levels are produced. Further, p-doping levels are generated without the need or use of carbon tetrachloride, which is an ozone depleter, thereby providing a safe and efficient method for generating aluminum gallium arsenide films for light-emitting devices, such as VCSEL, light-emitting diodes (LEDs), and the like.

Figure 3:
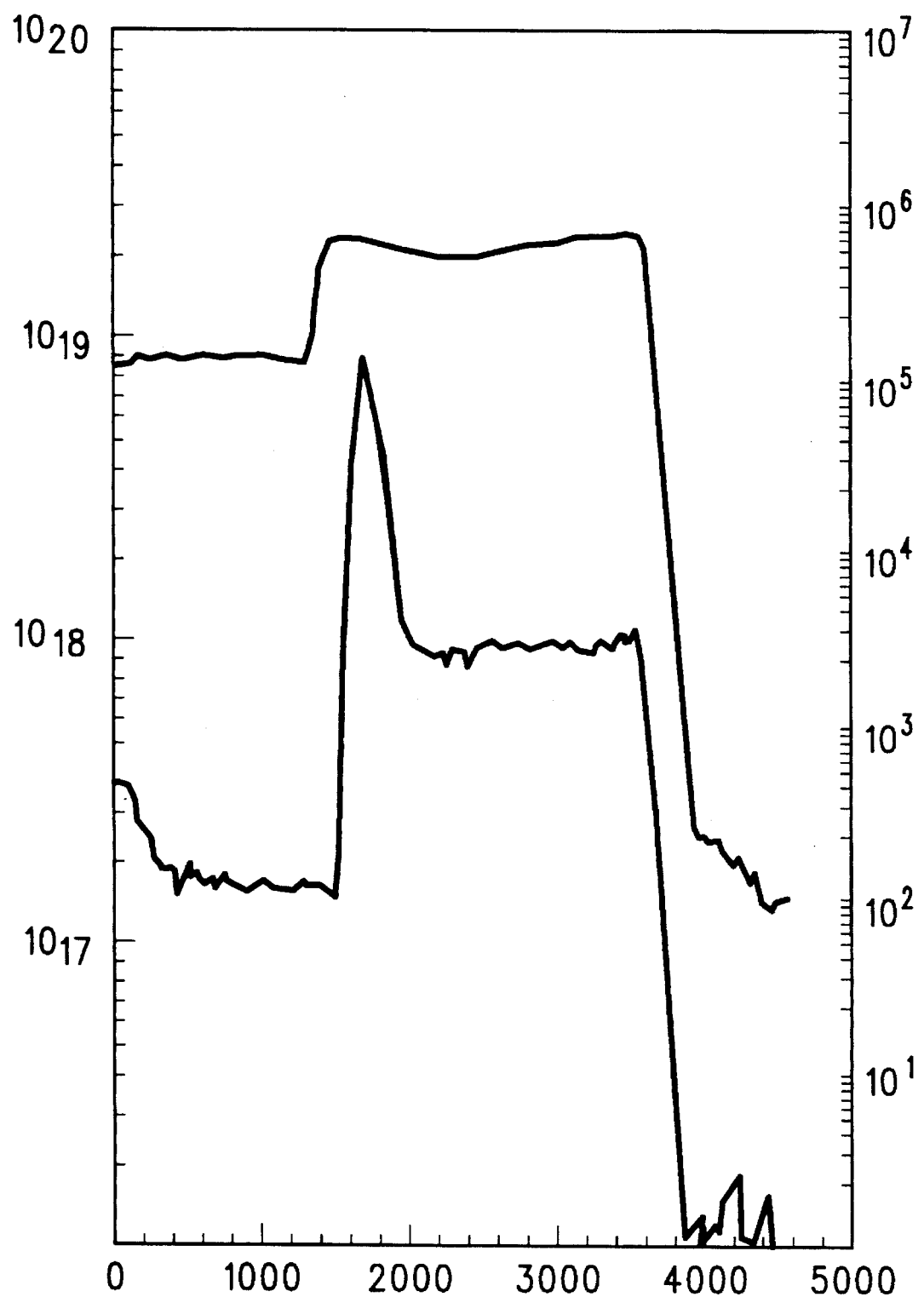
FIG. 3 is a graph of a SIMS (Secondary Ion Mass Spectrometry) illustrating depth profile of carbon concentration through two layers of aluminum gallium arsenide, the first layer being 15 percent aluminum and the second layer being 80 percent aluminum with local enhancement of the carbon concentration at an interface because of selection of the V/III ratio.

FIG. 3 is a SIMS (Secondary Ion Mass Spectrometry) depth profile, illustrating carbon concentration atoms per cubic centimeter as a function of depth in angstroms in an aluminum gallium arsenide layer, having a 15 percent aluminum concentration deposited on an aluminum gallium arsenide layer, having an 80 percent aluminum concentration.

Lines 401 and 402 illustrate carbon and aluminum concentration as a function of depth respectively. Portions 403 and 404 of lines 401 and 402 show concentration levels of carbon and aluminum at or near the surface of the aluminum gallium arsenide layer, having 15 percent aluminum concentration and 80 percent concentration, respectively. Portions 406 and 407 show concentration levels of carbon and aluminum in bulk or the interior of the aluminum gallium arsenide layer, respectively. As can be seen in FIG. 3, bulk concentration of carbon and aluminum is even and consistent. However, at interface portions 408 and 409 between aluminum gallium arsenide layers having 15 percent and 80 percent aluminum, carbon concentration is locally enhanced by decreasing the V/III ratio, while the aluminum concentration is adjusted to desired levels. Once the carbon concentration is spiked or increased at the interface, the carbon concentration, i.e., portion 415 of line 401, is adjusted to a desired level, thus demonstrating modifiability of carbon concentration at the interface of the two aluminum gallium arsenide layers. Further, modification of carbon concentration of DBRs 111 (shown in FIG. 2) provides additional reduction of a series resistance, thereby increasing performance of DBRs 111. This increase in performance is caused by modulation of V/III ratio at the interface of aluminum gallium arsenide layers to produce the spike in carbon concentration. Thus, providing a higher p-doping level at the interface, contributes further to the reduction of a barrier height for carriers resulting from a bandgap discontinuity between alternating layers of different aluminum concentrations.

By now it should be appreciated that a novel method for the growth and doping of p-doped layers, such as DBRs, for VCSELs, LEDs, and the like that contain alternating layers of aluminum gallium arsenide films, has been provided. This method provides an environmentally safe and efficient way of producing these p-doped layers in a highly controllable and predictable fashion. Further, by selecting an appropriate ratio of Group V to Group III organometallic gas sources, p-doping is achieved without $CCl_4$, thus simplifying the doping process.

We claim:

1. A method for controlling a selected carbon level for p-type doping of a deposited layer in a DBR reflector comprising the steps of:

placing a semiconductor substrate into a chamber of an epitaxial deposition system and depositing layers of material thereon;

flowing a Group V organometallic vapor and flowing a Group III organometallic vapor having a first ratio into the chamber of the epitaxial deposition system to epitaxially deposit a first layer of aluminum gallium arsenide with a first selected carbon doping concentration in the first layer of aluminum gallium arsenide being deposited on the layers of material on the semiconductor substrate;

flowing a Group V organometallic vapor and flowing a Group III organometallic vapor having a second ratio lower than the first ratio and lower than a third ratio into the chamber of the epitaxial deposition system to epitaxially deposit an aluminum gallium arsenide material having a carbon doping concentration that increases to form a spike of carbon doping concentration greater than the first carbon doping concentration and greater than a second carbon doping concentration;

adjusting the flow of the Group V organometallic vapor and adjusting the flow of the Group III organometallic vapor having the third ratio into the chamber of the epitaxial deposition system to complete epitaxial deposition of a second layer of aluminum gallium arsenide with the second carbon doping concentration; and completing the DBR reflector with additional layers, thereby controlling carbon p-type dopant levels in a deposited layer of the DBR reflector.

2. A method for controlling a selected carbon level for p-type doping of a deposited layer in a DBR as claimed in claim 1 where, in the step of placing a semiconductor substrate into the chamber of the epitaxial deposition system, the semiconductor substrate is a gallium arsenide substrate.

3. A method for controlling a selected carbon level for p-type doping of a deposited layer in a DBR as claimed in claim 1 where, in the step of flowing a Group V organometallic vapor and a Group III organometallic vapor, wherein the Group V organometallic vapor includes a tertiarybutylarsine vapor and the Group III organometallic vapor include trimethylaluminum and trimethylgallium vapors.

4. A method for controlling a selected carbon level for p-type doping of a deposited layer in a DBR as claimed in claim 1 where, in the step of flowing a Group V organometallic vapor and Group III organometallic vapor having a first ratio, the first ratio ranges from 5 to 23.

5. A method for controlling a selected carbon level for p-type doping of a deposited layer in a DBR as claimed in claim 1 where, in the step of flowing a Group V organometallic vapor and Group III organometallic vapor into the chamber of the epitaxial deposition system, the epitaxial deposition system is a MOCVD epitaxial deposition chamber.

6. A method for controlling carbon doping levels of a deposited material in a light emitting device comprising the steps of:

providing a substrate having a surface;

depositing a first stack of mirrors on the surface of the substrate;

depositing a first cladding region on the first stack of mirrors;

depositing an active layer on the first cladding region;

depositing a second cladding layer on the active layer; and depositing a second stack of mirrors on the second cladding layer, the second stack of mirrors including alternating layers of aluminum gallium arsenide fabricated by reacting organometallic species, the alternating layers being deposited so as to alternate between a first aluminum concentration and a second aluminum concentration, as well as having carbon doping concentrations being controlled by a ratio of a Group V containing organometallic species to a Group III organometallic species, and with one of the alternating layers of aluminum gallium arsenide having an increased carbon concentration adjacent an interface between the alternating layers which increased carbon concentration is greater than carbon concentrations in either of the alternating layers forming the interface.

7. A method for controlling carbon doping levels of a deposited material in a light emitting device as claimed in claim 6 where, in the step of depositing a second stack of mirrors, the ratio of the Group V containing organometallic vapor to the Group III containing vapor is from 5.0 to 23.0.

8. A method for controlling carbon doping levels of a deposited material in a light emitting device as claimed in claim 6 where, in the step of depositing a second stack of mirrors, the Group V containing organometallic vapor is tertiarybutylarsine.

9. A method for, controlling carbon doping levels of a deposited material in a light emitting device as claimed in claim 6 where, in the step of depositing a second stack of mirrors, the Group III containing organometallic vapor is trimethylgallium.

10. A method for controlling carbon doping levels of a deposited material in a light emitting device as claimed in claim 6 where, in the step of depositing a second stack of mirrors, the Group III containing organometallic vapor is trimethylaluminum.

11. A method for controlling a selected carbon level for p-type doping of a deposited layer in a DBR reflector comprising the steps of:

placing a semiconductor substrate into a chamber of an epitaxial deposition system and depositing a plurality of layers of material thereon;

flowing a Group V organometallic vapor and a Group III organometallic vapor into the chamber of the epitaxial deposition system in a plurality of different ratios to epitaxially deposit on the plurality of layers of material on the semiconductor substrate a layer that includes aluminum gallium arsenide having a spike concentration of carbon doping controlled by a first ratio in the plurality of different ratios, the plurality of different ratios being selected so that the spike concentration of carbon doping is greater than carbon concentration of doping on either side of the spike; and completing the DBR reflector with additional layers to make a vertical cavity surface emitting laser, thereby controlling carbon p-type dopant levels in a deposited film of the DBR reflector.

12. A method for controlling a selected carbon level for p-type doping of a deposited layer in a DBR as claimed in claim 11 where, in the step of flowing a Group V organometallic vapor, the Group V organometallic vapor is tertiarybutylarsine.

13. A method for controlling a selected carbon level for p-type doping of a deposited layer in a DBR claimed in claim 11 where, in the step of flowing Group III organometallic vapor, one of the Group III organometallic vapor is trimethylgallium.

14. A method for controlling a selected carbon level for p-type doping of a deposited layer in a DBR as claimed in claim 11 where, in the step of flowing Group III organometallic vapor, one of the Group III organometallic vapor is trimethylaluminum.

15. A method for controlling a selected carbon level for p-type doping of a deposited layer in a DBR reflector comprising the steps of:

placing a semiconductor substrate into a chamber of an epitaxial deposition system and depositing layers of material thereon;

flowing a Group V organometallic vapor and flowing a Group III organometallic vapor having a first ratio into the chamber of the epitaxial deposition system to epitaxially deposit on the layers of material a first layer of aluminum gallium arsenide with a first selected carbon doping concentration;

flowing a Group V organometallic vapor and flowing a Group III organometallic vapor having a second ratio lower than the first ratio and lower than a third ratio into the chamber of the epitaxial deposition system to epitaxially deposit an aluminum gallium arsenide material having carbon doping concentration that increases to form a spike of carbon doping concentration greater than the first carbon doping concentration and greater than a second carbon doping concentration and having a thickness;

adjusting the flow of the Group V organometallic vapor and adjusting the flow of the Group III organometallic vapor into the chamber of the epitaxial deposition system to the third ratio to complete epitaxial deposition of a second layer of aluminum gallium arsenide with the second selected carbon doping concentration; and completing the DBR reflector with additional layers, thereby controlling carbon p-type dopant levels in a deposited layer of the DBR reflector.

16. A method for controlling a selected carbon level for p-type doping of a deposited layer in a DBR reflector as claimed in claim 15 where, in the step of flowing a Group V organometallic vapor and flowing a Group III organometallic vapor having a second ratio the flowing continues until the thickness of the spike concentration is approximately 700 Angstroms.

* * * * *